(12) United States Patent
Chiu

(10) Patent No.: US 8,881,931 B2
(45) Date of Patent: Nov. 11, 2014

(54) WATERPROOF AND BREATHABLE PLUG

(75) Inventor: Teh-Tsung Chiu, New Taipei (TW)

(73) Assignee: AVC Industrial Corp., New Taipei (TW)

( * ) Notice: Subject to any disclaimer, the term of this patent is extended or adjusted under 35 U.S.C. 154(b) by 230 days.

(21) Appl. No.: 13/414,500

(22) Filed: Mar. 7, 2012

(65) Prior Publication Data

US 2012/0168453 A1 Jul. 5, 2012

Related U.S. Application Data

(63) Continuation-in-part of application No. 12/871,027, filed on Aug. 30, 2010, now abandoned.

(51) Int. Cl.
*B65D 51/16* (2006.01)
*H05K 5/02* (2006.01)

(52) U.S. Cl.
CPC ..................................... *H05K 5/0213* (2013.01)
USPC ........... 220/371; 220/372; 220/745; 220/253; 220/203.06; 215/264; 215/314; 215/308

(58) Field of Classification Search
USPC .......................... 215/261, 307, 308, 313, 314; 220/203.05, 203.06, 371, 372, 745; 220/253; 152/364
See application file for complete search history.

(56) References Cited

U.S. PATENT DOCUMENTS

| 4,285,905 A * | 8/1981 | Feit ................................... 422/4 |
| 2003/0047562 A1 * | 3/2003 | Wu et al. ....................... 220/300 |
| 2005/0227610 A1 * | 10/2005 | Zukor et al. ................... 454/339 |

OTHER PUBLICATIONS

U.S. Appl. No. 12/871,027, filed Aug. 30, 2010.

* cited by examiner

*Primary Examiner* — Fenn Mathew
*Assistant Examiner* — James N Smalley
(74) *Attorney, Agent, or Firm* — Ming Chow; Sinorica, LLC

(57) ABSTRACT

A waterproof and breathable plug is provided. A protection net is assembled with one side or two sides of a waterproof and breathable membrane, to prevent insects from contacting and damaging the waterproof and breathable membrane. A collet is further assembled with the waterproof and breathable membrane, to prevent the waterproof and breathable membrane from moving, contracting and being deformed. The collet is also easily to be assembled in a breathable bolt. The waterproof and breathable plug is adjustable to regulate the breathing rate, fitting different electrical boxes or different weather conditions. Therefore, the problems of the prior art that the conventional waterproof and breathable membrane is easily bit by insects, the waterproof and breathable membrane has a constant-sized opening that cannot regulate the air amount, and the waterproof and breathable membrane is likely deformed due to the bad weather and high humidity and temperature are thus overcome.

20 Claims, 19 Drawing Sheets

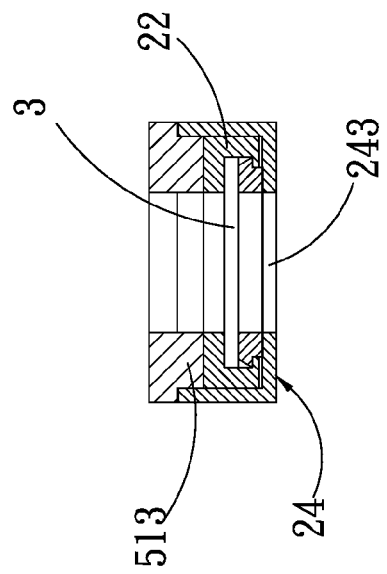
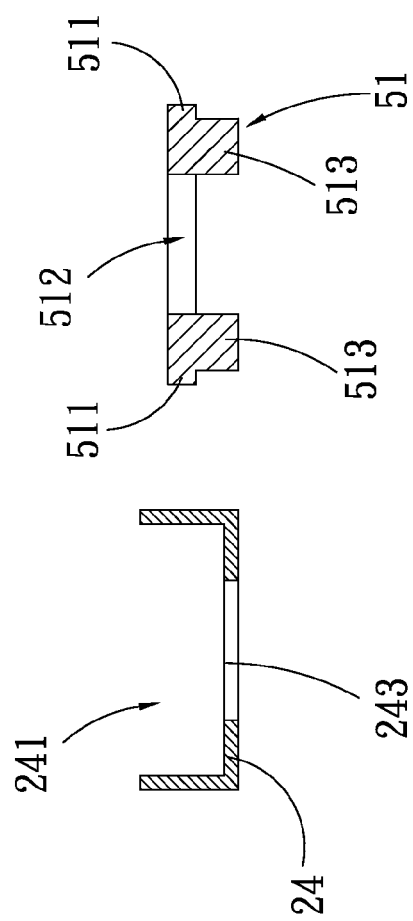
Fig. 12A
Fig. 12B

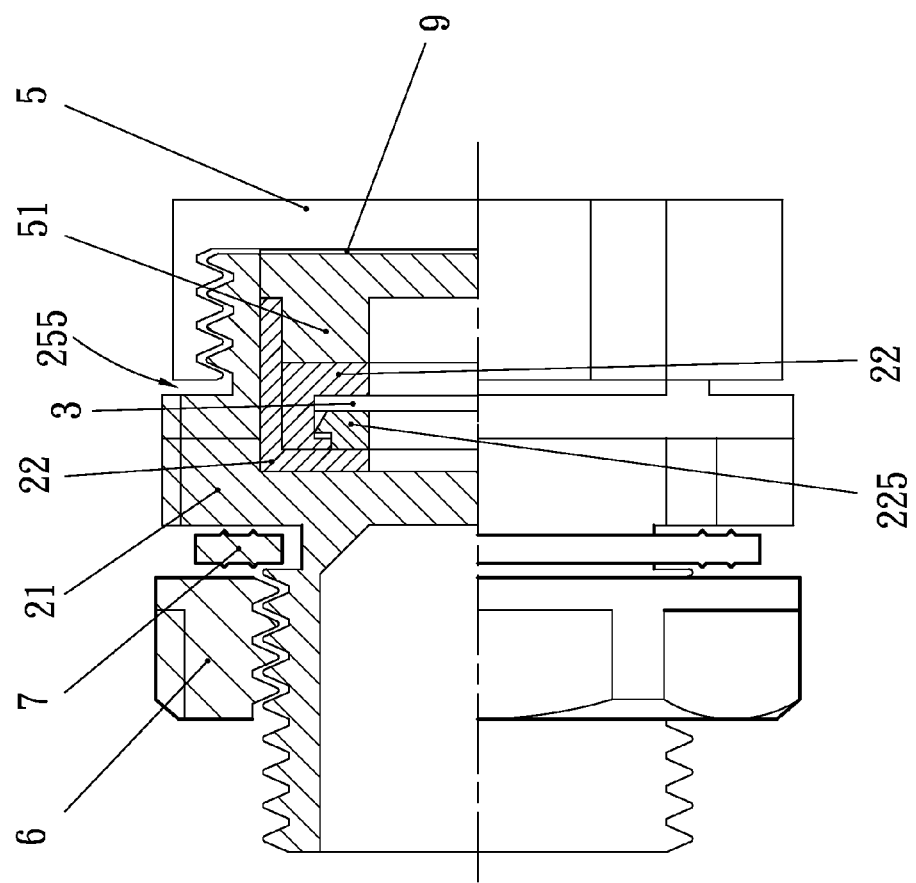

WATERPROOF AND BREATHABLE PLUG

CROSS-REFERENCE TO RELATED APPLICATIONS

This application is a continuation-in-part of application Ser. No. 12/871,027 filed Aug. 30, 2010, the entire contents of which are incorporated herein by reference.

BACKGROUND OF THE INVENTION

1. Field of the Invention

This invention relates to waterproof and breathable plugs for waterproof boxes, and, more particularly, to a waterproof and breathable plug having a waterproof and breathable membrane that is not bitable by insects.

2. Description of Related Art

A waterproof box, especially an electrical box, has a variety of electronic components mounted therein. In general, the electrical box has a box body made of metal. When water molecules enter the box body or hot and cold air exchange in the box body, the electronic components may get rusted. In order to expel the water molecules, an electrical box is generally provided with a through hole and a waterproof and breathable plug mounted in the through hole.

A waterproof and breathable plug has to have great enough air ventilation amount and waterproof capability, in order to be effectively used in bad weather, such as stormy weather or hurricane. However, the electrical box, and the through hole as well, has a constant size, and the waterproof capability is thus limited.

Therefore, how to provide a novel waterproof and breathable plug is becoming one of the most popular issues in the art.

SUMMARY OF THE INVENTION

In order to solve the problems of the prior art that the conventional waterproof and breathable membrane is easily bit by insects, the waterproof and breathable membrane has a constant-sized opening that cannot regulate the air amount, and the waterproof and breathable membrane is likely deformed due to the bad weather and high humidity and temperature, the present invention provides a waterproof and breathable plug having a waterproof and breathable membrane that is mounted in an air passage of the waterproof and breathable plug, for allowing air to flow therethrough but prohibiting the water molecules from entering the electrical box. The present invention also provides a waterproof and breathable plug having a protection net assembled in a plurality of arched blocks to prop against one or two sides of the waterproof and breathable membrane and prevent insects from biting and damaging the waterproof and breathable membrane. Further, the waterproof and breathable plug has free openings with adjustable sizes. Therefore, the air ventilation rate of the electrical box may be increased by adjusting the size of the free openings.

In an embodiment, a collet or a box body is further provided. The collet is fixed to the waterproof and breathable membrane securely to prevent the waterproof and breathable membrane from deformation. The collet may be also assembled in the box body, and then assembled, together with the box body, in the waterproof and breathable plug.

The present invention provides a waterproof and breathable plug, comprising: a plug body comprising a mounting base, a tubular screw rod and a plurality of arched blocks, wherein the mounting base has an air vent disposed in a central region thereof, the tubular screw rod is formed on one side of the mounting base and communicating with the air vent, each of the arched blocks has an outer thread disposed on an outer wall thereof, the arched blocks surround the air vent on the other side of the mounting base, and the arched blocks have gaps therebetween defining free openings; a waterproof and breathable membrane assembled in the arched blocks; a cover member comprising a cap nut, the cap nut having a recessed chamber formed on an inner side thereof, the recessed chamber having a threaded inner wall disposed on a periphery thereof; and an air valve assembled in the recessed chamber of the cover member and spaced from the threaded inner wall at an interval, the outer threads of the arched blocks of the plug body being screwed into the interval and screwed with the threaded inner wall, the air valve penetrating inner sides of the arched blocks.

Compared with the conventional waterproof and breathable plug, the waterproof and breathable plug of the present invention has the protection net assembled in the arched blocks and propping against one or two sides of the waterproof and breathable membrane, to prevent insects from contacting or damaging the waterproof and breathable membrane. The waterproof and breathable plug of the present invention further has free openings with adjustable sizes. Therefore, the air ventilation rate of the electrical box may be increased by adjusting the size of the free openings.

The present invention further provides a collet or a box body is further provided. The collet is fixed to the waterproof and breathable membrane securely to prevent the waterproof and breathable membrane from deformation. The collet may be also assembled in the box body, and then assembled, together with the box body, in the waterproof and breathable plug.

BRIEF DESCRIPTION OF DRAWINGS

The invention can be more fully understood by reading the following detailed description of the preferred embodiments, with reference made to the accompanying drawings, wherein:

FIG. 12A is a cross-sectional view of a box body and an air valve of an embodiment according to the present invention;

FIG. 12B is a cross-sectional view of the box body and the air valve of FIG. 12A assembled with a collet;

FIG. 13 is a cross-sectional view of an assembly of an embodiment according to the present invention.

DETAILED DESCRIPTION OF THE INVENTION

The following illustrative embodiments are provided to illustrate the disclosure of the present invention, and these and other advantages and effects can be apparently understood by those in the art after reading the disclosure of this specification. The present invention can also be performed or applied by other different embodiments. The details of the specification may be on the basis of different points and applications, and numerous modifications and variations can be devised without departing from the spirit of the present invention.

Figure 1A:
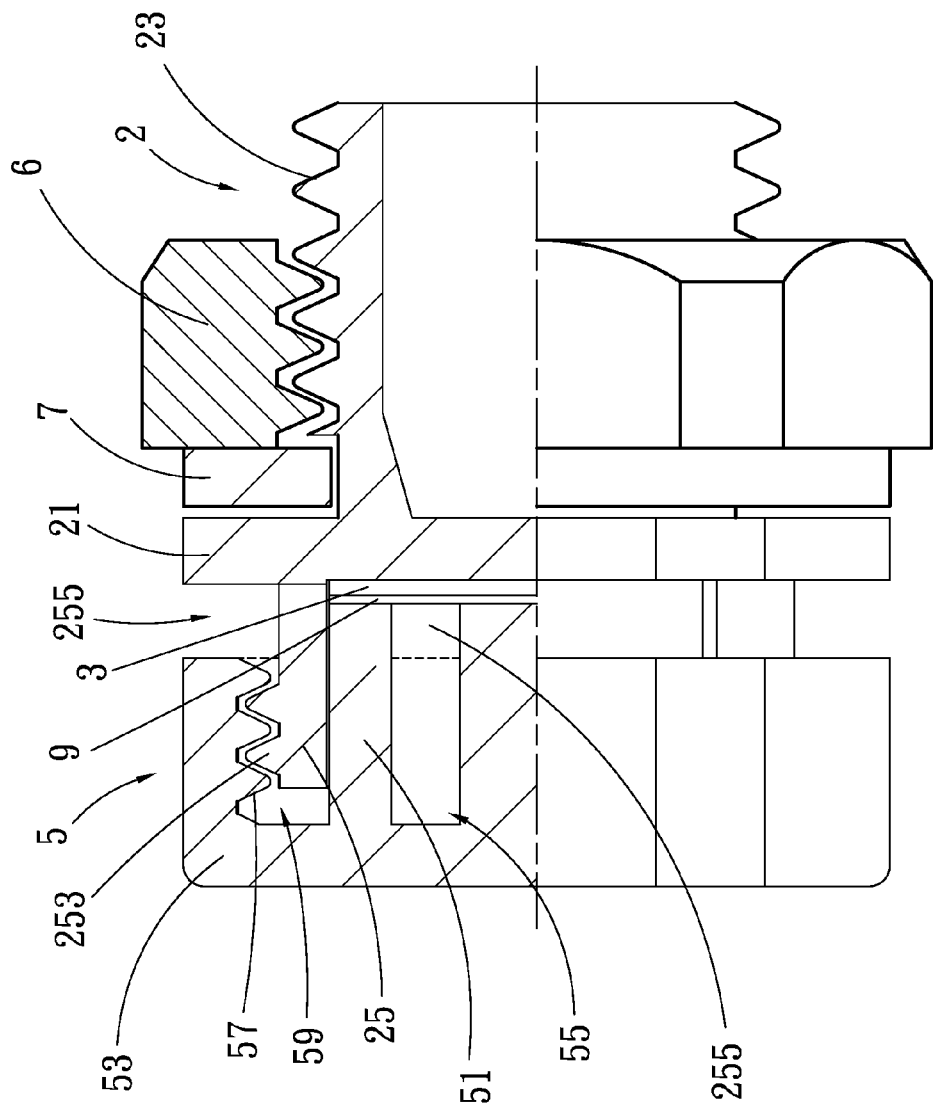
FIG. 1A is a cross-sectional view of a waterproof and breathable plug of an embodiment according to the present invention.
Figure 1B:
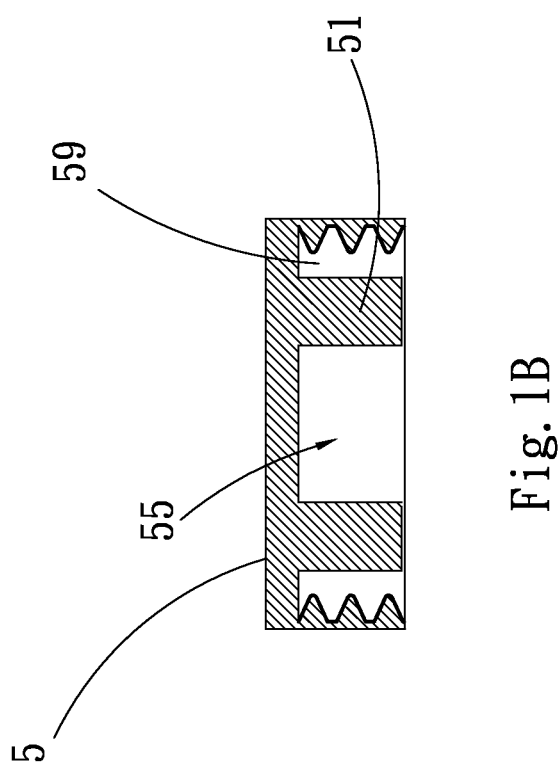
FIG. 1B is a cross-sectional view of a cover member of the waterproof and breathable plug of FIG. 1A.
Figure 2:
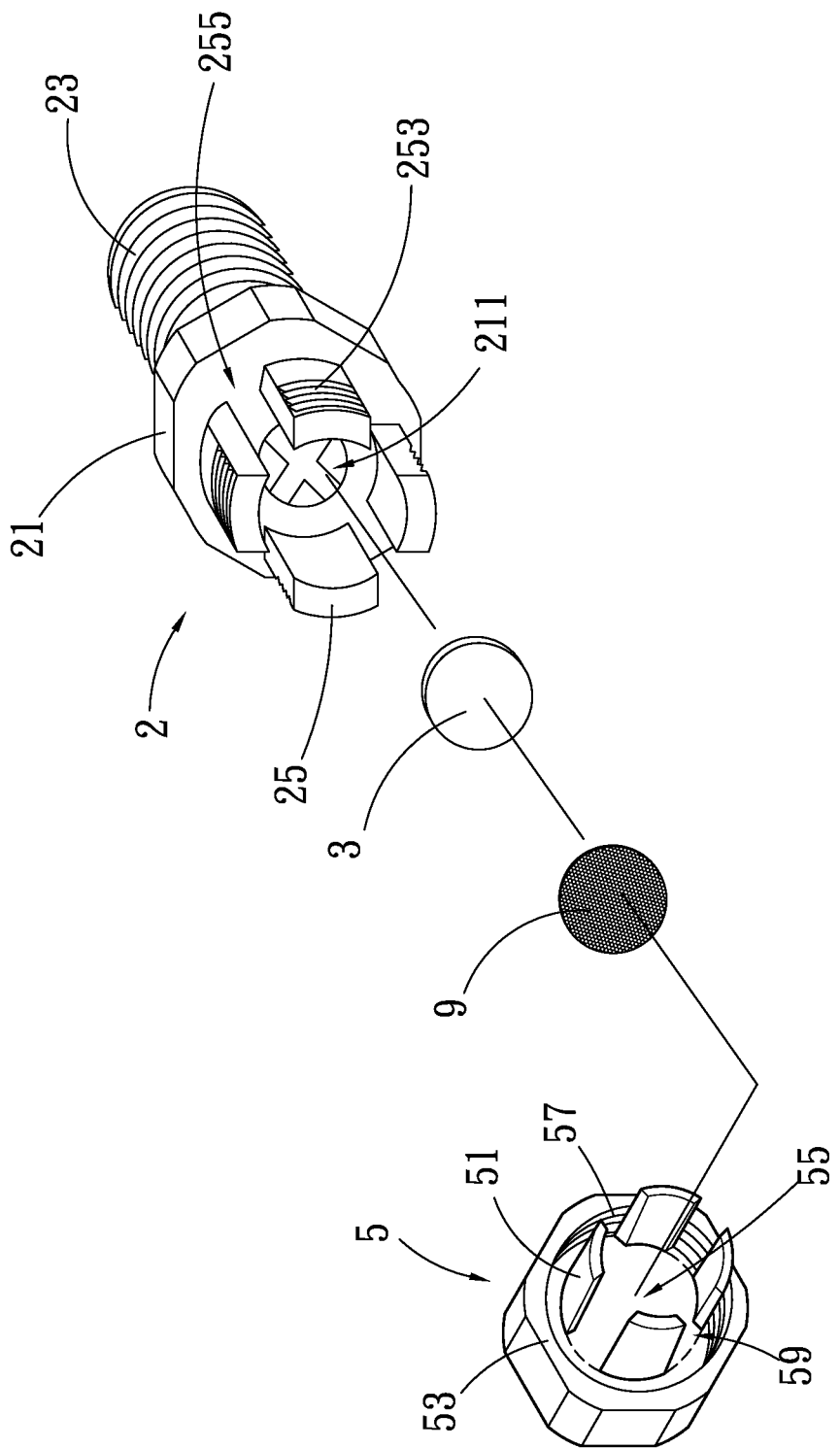
FIG. 2 is an exploded view of the waterproof and breathable plug of FIG. 1A.

Referring to FIGS. 1A, 1B and 2, a waterproof and breathable plug of an embodiment according to the present invention is provided.

The waterproof and breathable plug comprises a plug body 2, at least a waterproof and breathable membrane (cloth) 3, and a cover member 5. In an embodiment, the plug body 2 comprises a mounting base 21, a tubular screw rod 23, and a plurality of arched blocks 25. The mounting base 21 has an air vent 211 in a central region thereof. The tubular screw rod 23 is formed at one side of the mounting base 21 and communicates with the air vent 211. The arched blocks 25 have outer threads 253 formed on a portion of outer walls 251 thereof. The arched blocks 25 are installed on the other side of the mounting base 21 and equiangularly surround the air vent 211. A plurality of openings 255 are respectively defined between adjacent arched blocks 25. The waterproof and breathable membrane (cloth) 3 is attached to the air vent 211 and surrounded by the arched blocks 25, for allowing air to flow therethrough but prohibiting the water molecules from entering an electrical box plugged with the waterproof and breathable plug. The cover member 5 comprises a cap nut 53. In an embodiment, the cap nut 53 has a recessed chamber 55 formed on an inner side thereof, and the recessed chamber 55 has a threaded inner wall 57 formed on a periphery thereof.

Figure 12C:
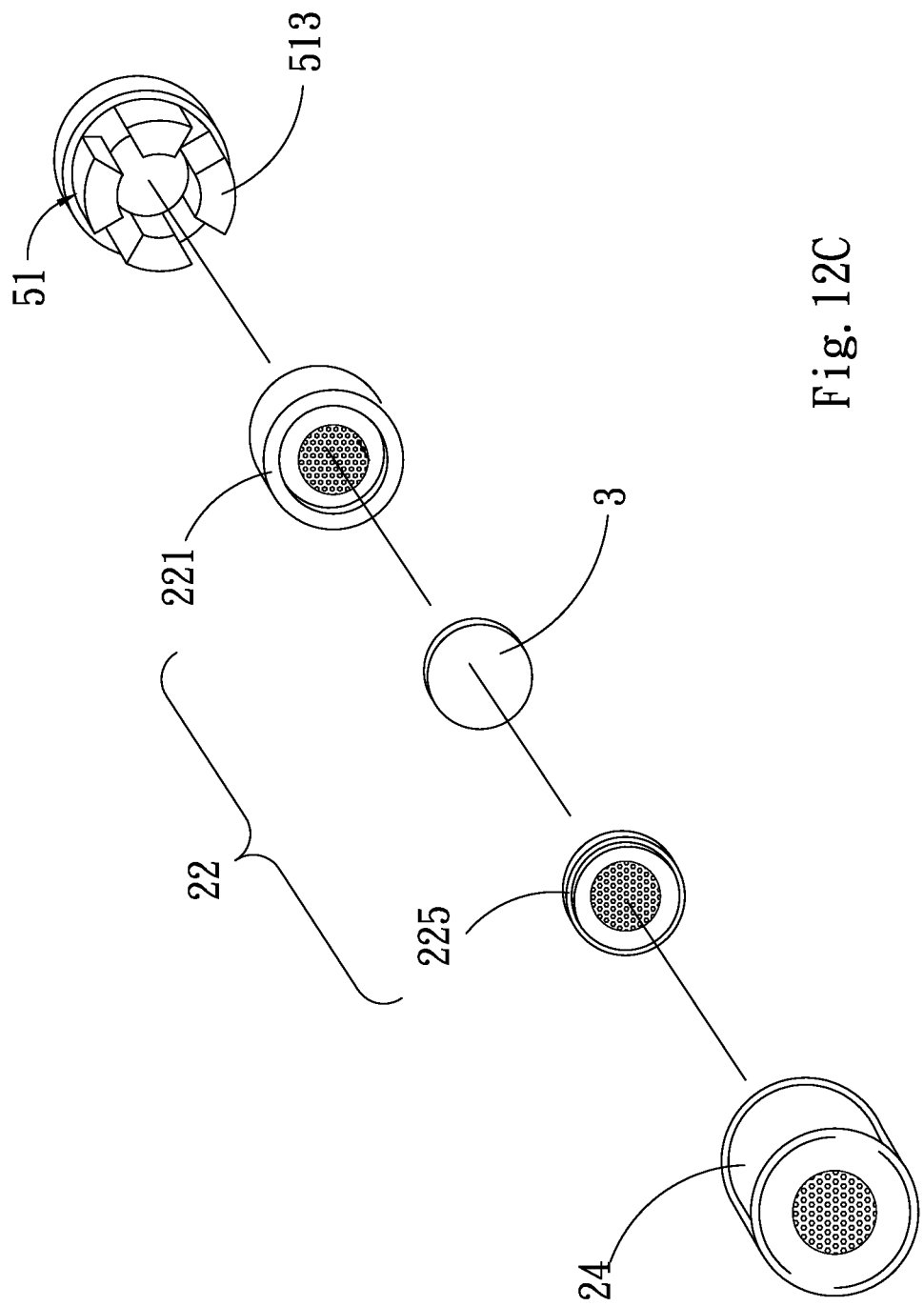
FIG. 12C is an exploded view of FIG. 12B.
Figure 12D:
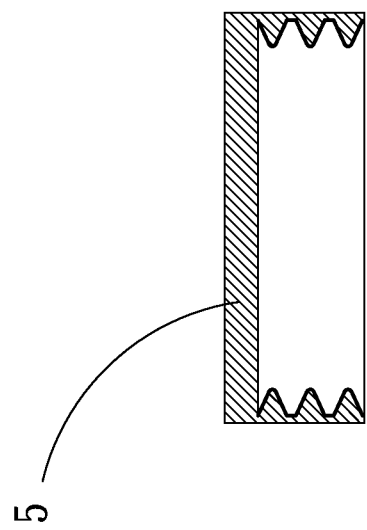
FIG. 12D is a cross-sectional view of a cover member of an embodiment according to the present invention.

An air valve 51 is assembled in the recessed chamber 55 of the cover member 5. The air valve 51 comprises a plurality of valve pieces 513 (referring to FIG. 12) perpendicularly assembled in the recessed chamber 55 of the cover member 5 and spaced from the threaded inner wall 57 at an interval 59. The outer threads 253 of the arched blocks 25 of the plug body 2 are inserted into the interval 59 and screwed with the threaded inner wall 57. The cover member 5 also covers a portion of the free openings 255 of the plug body 2, with another portion of the free openings 255 being exposed, for air to pass therethrough. The air valve 51 penetrates an inner side of the arched blocks 25.

In an embodiment the air valve 51 comprises a plurality of valve pieces 513 perpendicularly mounted inside the recessed chamber 55. The air valve 51 has free ends propping against elements inside the arched blocks 25.

Moreover, the embodiment is further assembled with a first protection net 9. The first protection net 9 is assembled in the arched blocks 25 to prop against one side of the waterproof and breathable membrane 3. The air valve 51 props against the first protection net 9. The first protection net 9 in turn props against one side of the waterproof and breathable membrane 3. The first protection net 9 prevents insects from contacting, biting and damaging the waterproof and breathable membrane 3. The first protection net 9 further prevents the waterproof and breathable membrane 3 from contraction and deformation or movement. In other words, the waterproof and breathable membrane 3 can be easily, smoothly mounted in the air passage of the waterproof and breathable plug, and will not be deformed after absorbing moisture, even if the waterproof and breathable membrane 3 is very thin.

In an embodiment, the plug 2 has four arched blocks 25, and the cover member 5 has four air valves 51.

Therefore, the first protection net 9 is assembled in the arched blocks 25 to prop against one side of the waterproof and breathable membrane 3. When insects invade the present invention via the free openings 255, the first protection net 9 is disposed before and covers the waterproof and breathable membrane 3 such that the insects can not contact and damage the waterproof and breathable membrane 3. The cover member 5 may be finely tuned to move leftward or rightward, to rotate the air valve 51 to cover and adjust the size of the free openings 255 and thus the amount of the air passage. When the present invention is used with an electronic box (not shown), the electronic box may adjust the size of the free end opening with the waterproof and breathable plug of the present invention, in order to change the size of the air passage and the breathing rate.

In an embodiment, the air valve 51 is an arc-shaped sliding blade in cooperation with the arched blocks 25 of the plug body 2. Therefore, the arc-shaped air valve 51 may smoothly, tightly adjust and cover the free openings 255.

Referring to FIGS. 3, 4, 5A, 5B and 6, another embodiment according to the present invention is shown. In the embodiment, the waterproof and breathable membrane 3 is further assembled with a collet 22, in which a receiving space for an element to be received therein is formed. The collet 22 comprises a collet opening 221, a plurality of first air through holes 223 and a collet cap 225. The collet opening 221 is formed on one side of the collet 22, and the first air through holes 223 are formed on the other side of the collet 22. The collet cap 225 has a plurality of second air through holes 2251 disposed in a central region thereof. The waterproof and breathable membrane 3 is assembled in the collet 22. The collet cap 225 is assembled with the collet opening 221. The collet 22 is assembled on the air vent 211 in the arched blocks 25. The first protection net 9 is disposed adjacent to an outer side of the collet 22, or is disposed in the collet 22, to prop against one side of the waterproof and breathable membrane 3, to prevent insects from contacting and damaging the waterproof and breathable membrane 3. In the embodiment shown in FIG. 6, the first protection net 9 is disposed on the outer side of the collet 22, such that the threaded inner wall 57 of the cover member 5 is screwed with the outer threads 253 of the arched blocks 25. The free end of the air valve 51 props against the first protection net 9, and the first protection net 9, in turn, props against one side of the collet 22.

In an embodiment, the first air through holes 223 or the second air through holes 2251 (shown in FIG. 3) are small in size for acting as air passages. Therefore, the collet 22 has more area left to clamp the waterproof and breathable membrane 3 therebetween to form a sandwich structure. Accordingly, the waterproof and breathable membrane 3 is unlikely to move. Referring to FIG. 4, another embodiment of the air through holes is shown. In the another embodiment, the collet 22 has only one big first air through hole 223 and the callop cap 25 also has only one big second air through hole 2251, and the collet 22 thus clamps the periphery of the waterproof and breathable membrane 3, to form the sandwich structure. Accordingly, the waterproof and breathable membrane 3 is unlikely to move.

Since the waterproof and breathable membrane 3 is assembled in the collet 22, the waterproof and breathable membrane 3 may be easily, quickly assembled, together with the collet 22, into the arched blocks 25 of the waterproof and breathable plug with bare hands.

Figure 8:
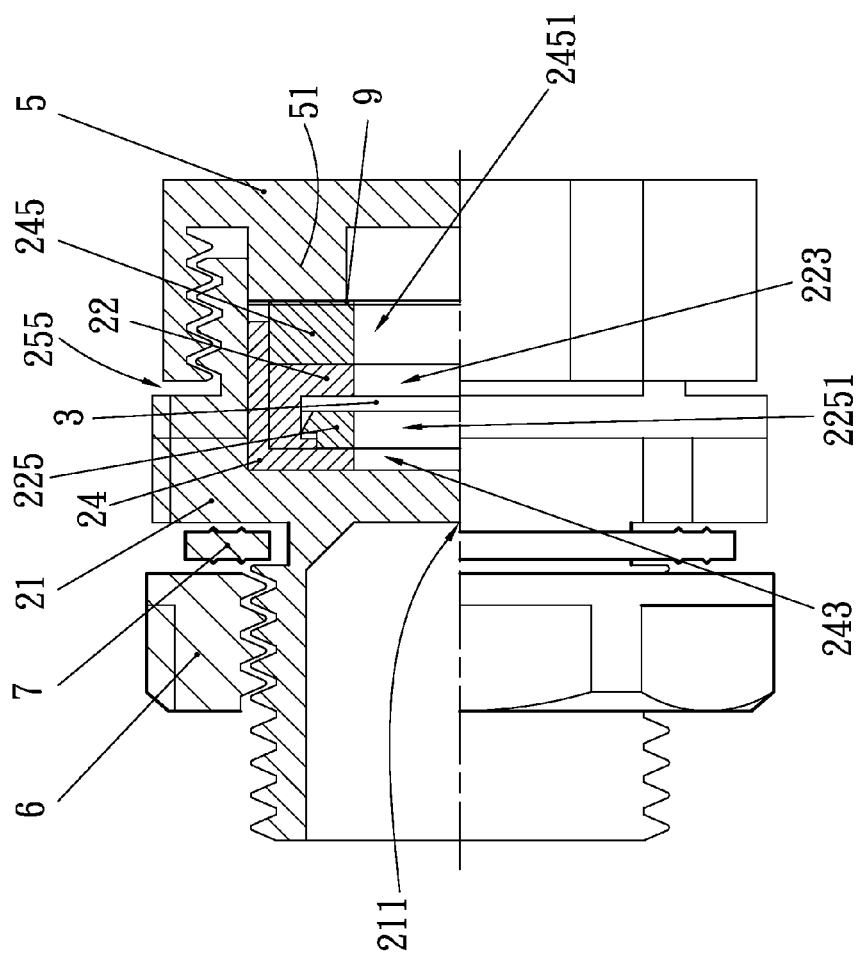
FIG. 8 is a schematic diagram of an assembly of an embodiment according to the present invention.
Figure 9A:
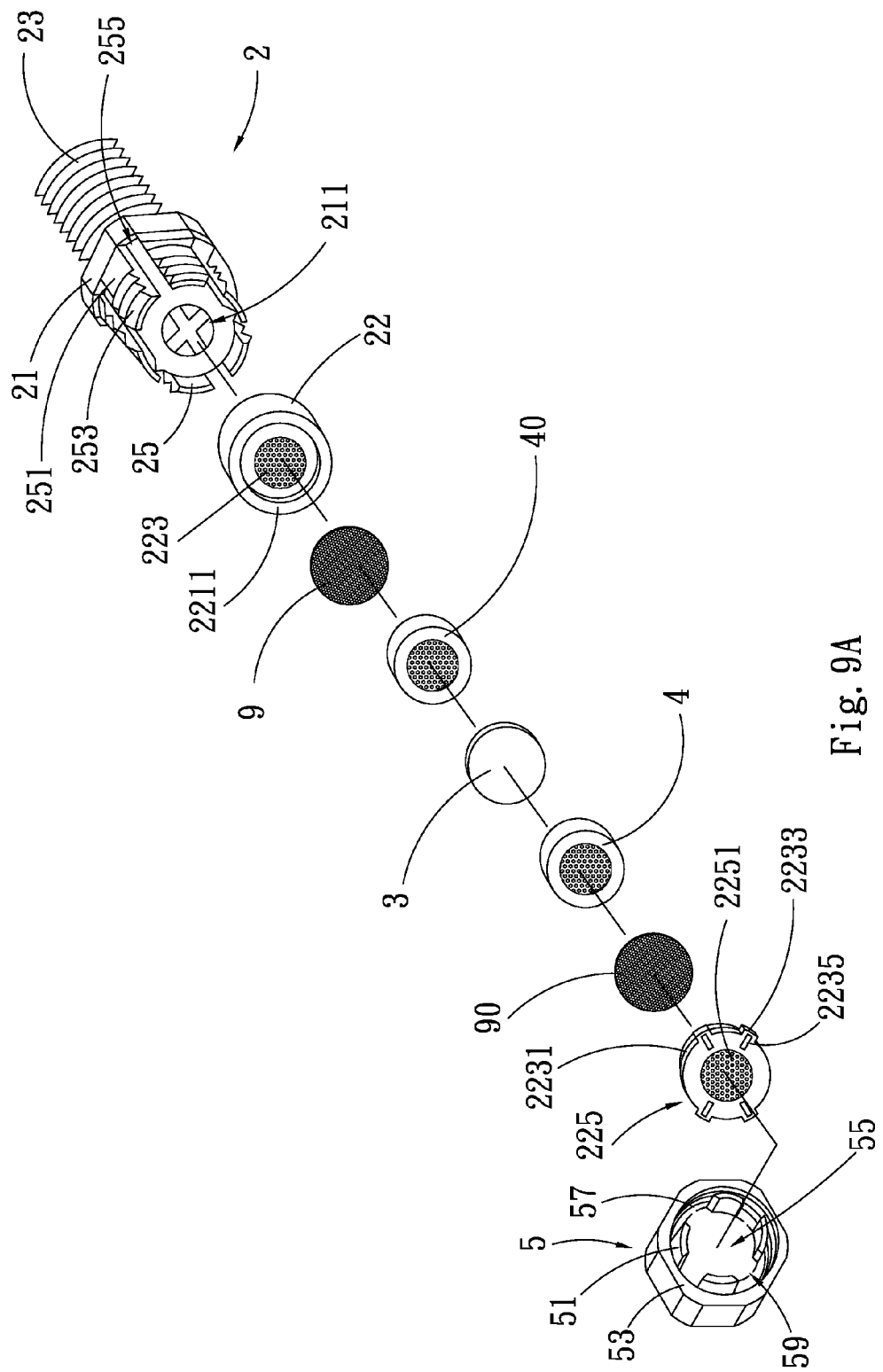
FIG. 9A is an exploded view of another embodiment according to the present invention.
Figure 9B:
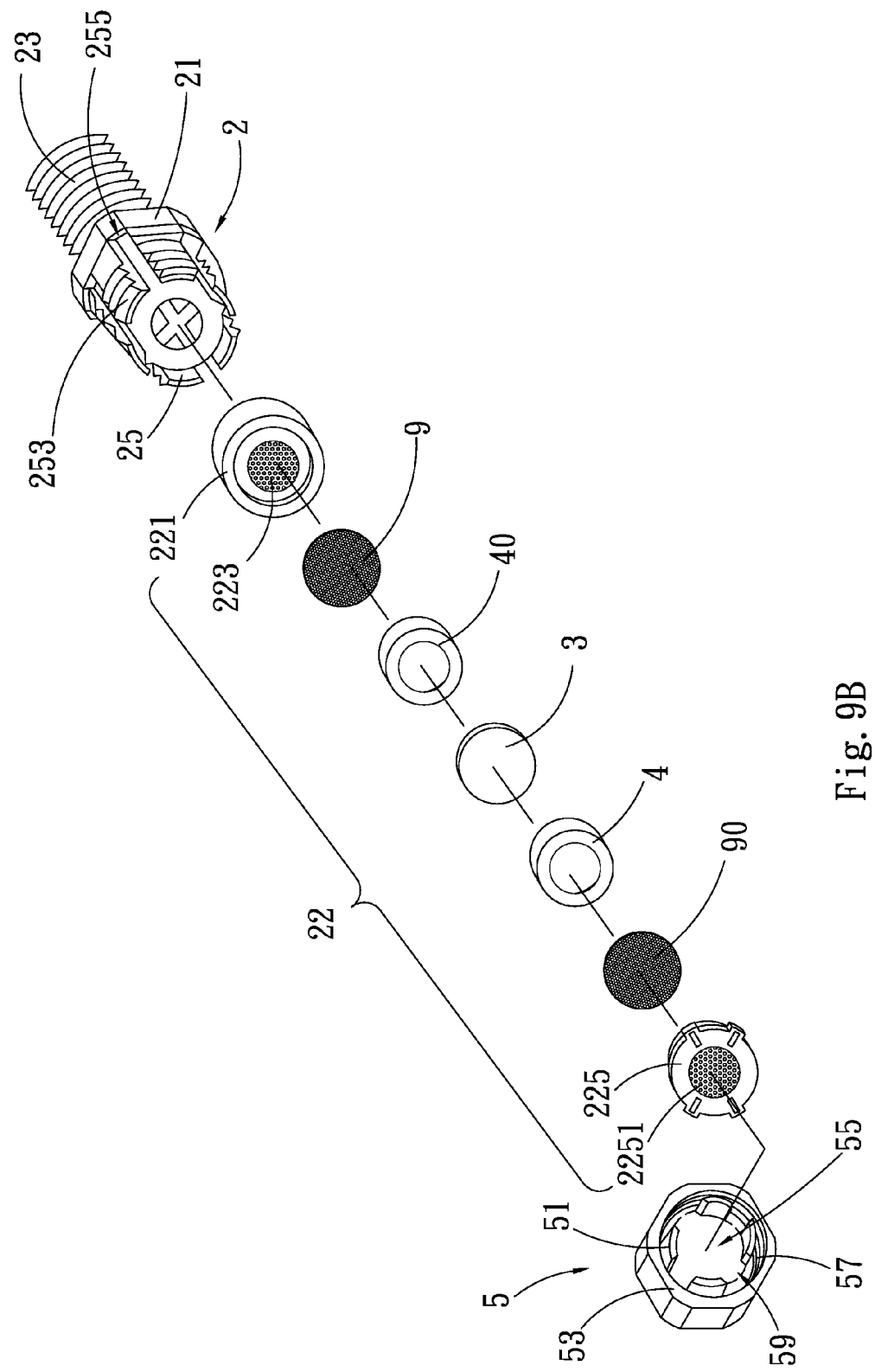
FIG. 9B is cross-sectional view of another embodiment of FIG. 9A.
Figures 10A, 10B:
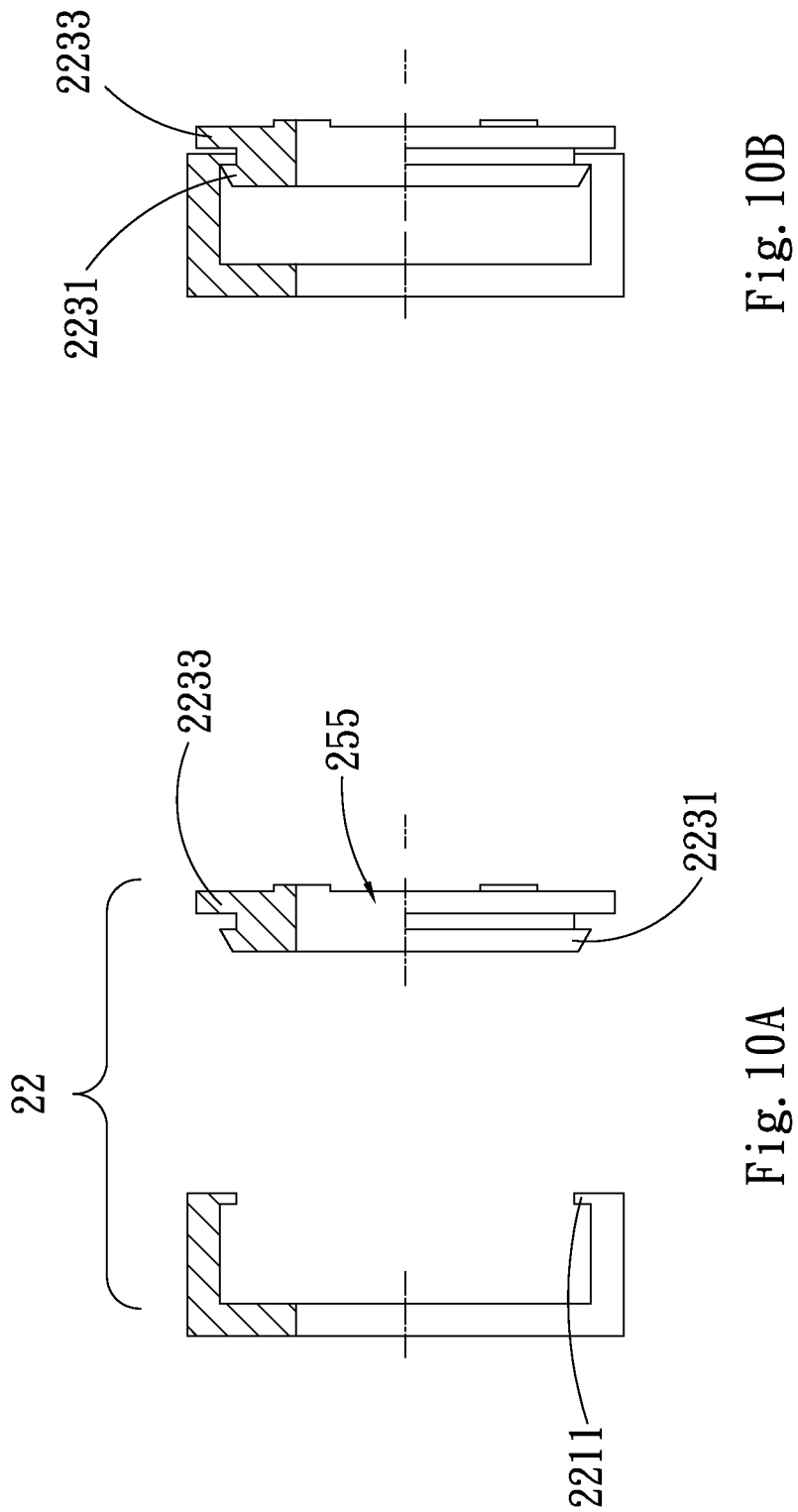
FIG. 10A is an exploded view of the collet of FIG. 9A or FIG. 9B.
FIG. 10B is an exploded view of another embodiment of FIG. 10A.
Figure 11:
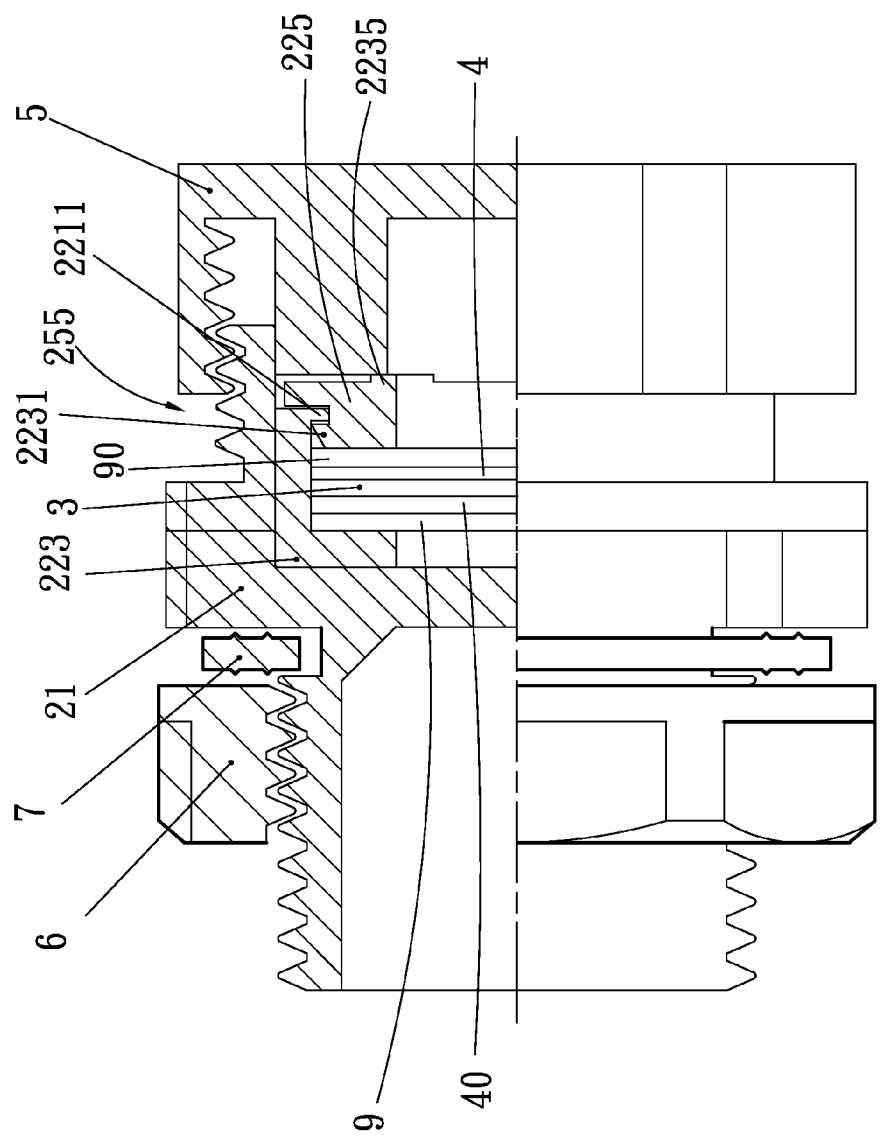
FIG. 11 is a cross-sectional view of an assembly of an embodiment according to the present invention.

Referring to FIGS. 7A, 7B, 7C, 7D and 8, yet another embodiment is shown. In the yet another embodiment, the collet 22 is further assembled with a box body 24. In an embodiment, the box body 24 is made of metal or soft material, such as rubber and plastic soft material. The box body 24 comprises an opening 241, a third air through hole 243, and a box cover 245. The opening 241 is formed on one side of the box body 24. The third air through hole 243 is formed on the other side of the box body 24. The box cover 245 has a fourth air through hole 2451 in a central region thereof. The collet 22 is assembled in the box body 24. The box cover 245 is further assembled in the opening 241. The air valve 51 of the embodiment is lower, in order to be assembled with the box body 24 that has a certain depth, to prop against and fix the box body 24 in the arched blocks 25 (referring to FIGS. 7D and 8). As shown in FIG. 8, the first protection net 9 is disposed outside of the box body 24, and the free end of the air valve 51 props against the first protection net 9 and the first protection net 9 in turn props against one side of the box body 24, to prevent insects from contacting and damaging the box body 24, the collet 22 and the waterproof and breathable membrane 3.

Referring to FIG. 8, an embodiment of the present invention assembled with an electrical box is shown. Air flows via the free openings 255, the first protection net 9, the fourth air through hole 245, the first air through hole 223, the waterproof and breathable membrane 3, the second air through hole 2251, the third air through hole 243 and the air vent 211 and communicates air in the electrical box. Accordingly, the collet 22 and the waterproof and breathable membrane 3 therein is prevented by the box body 24 from deformation and sliding, so as to achieve perfect engagement and waterproof effects.

Figure 3:
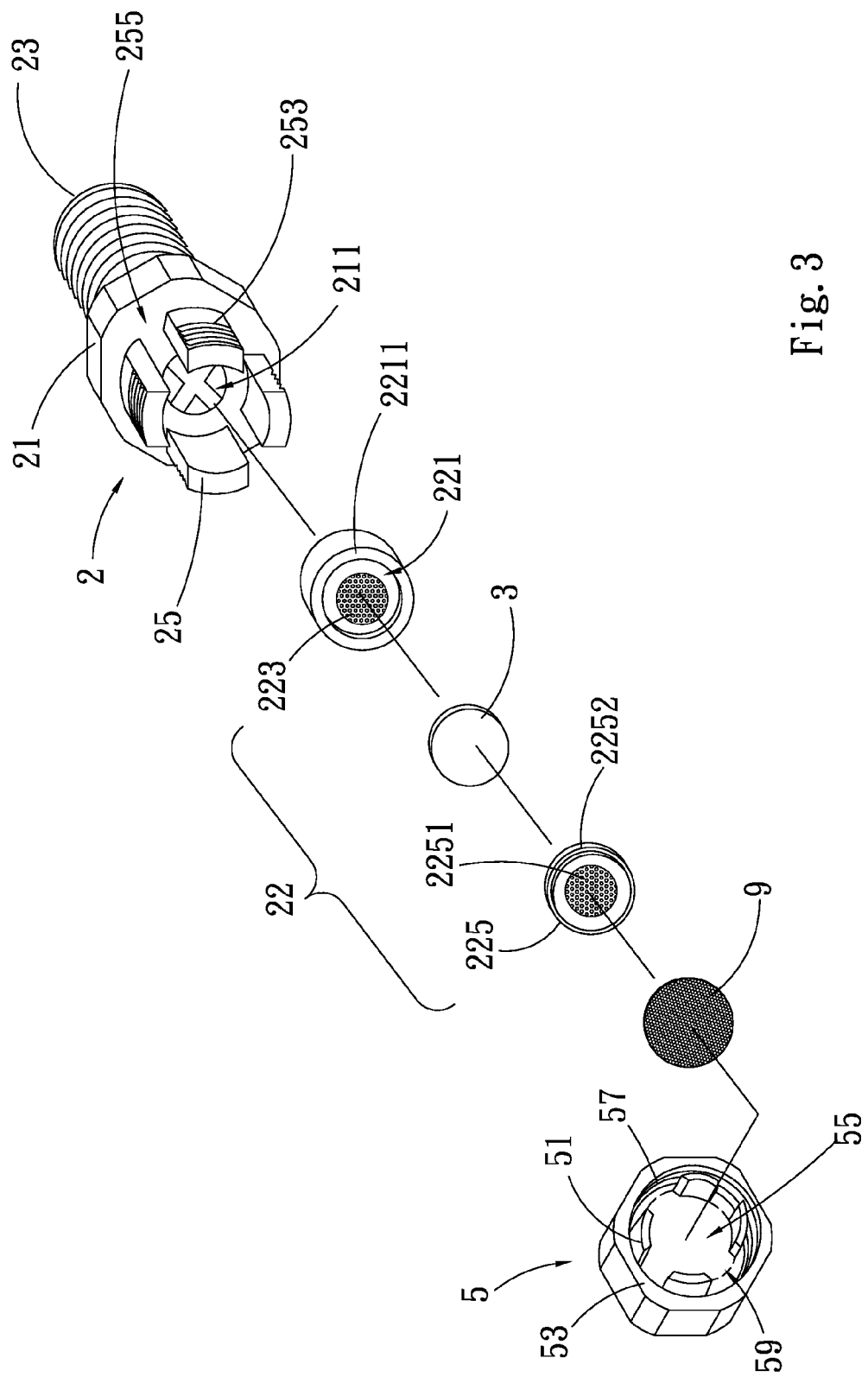
FIG. 3 is an exploded view of a waterproof and breathable plug of another embodiment according to the present invention.
Figure 4:
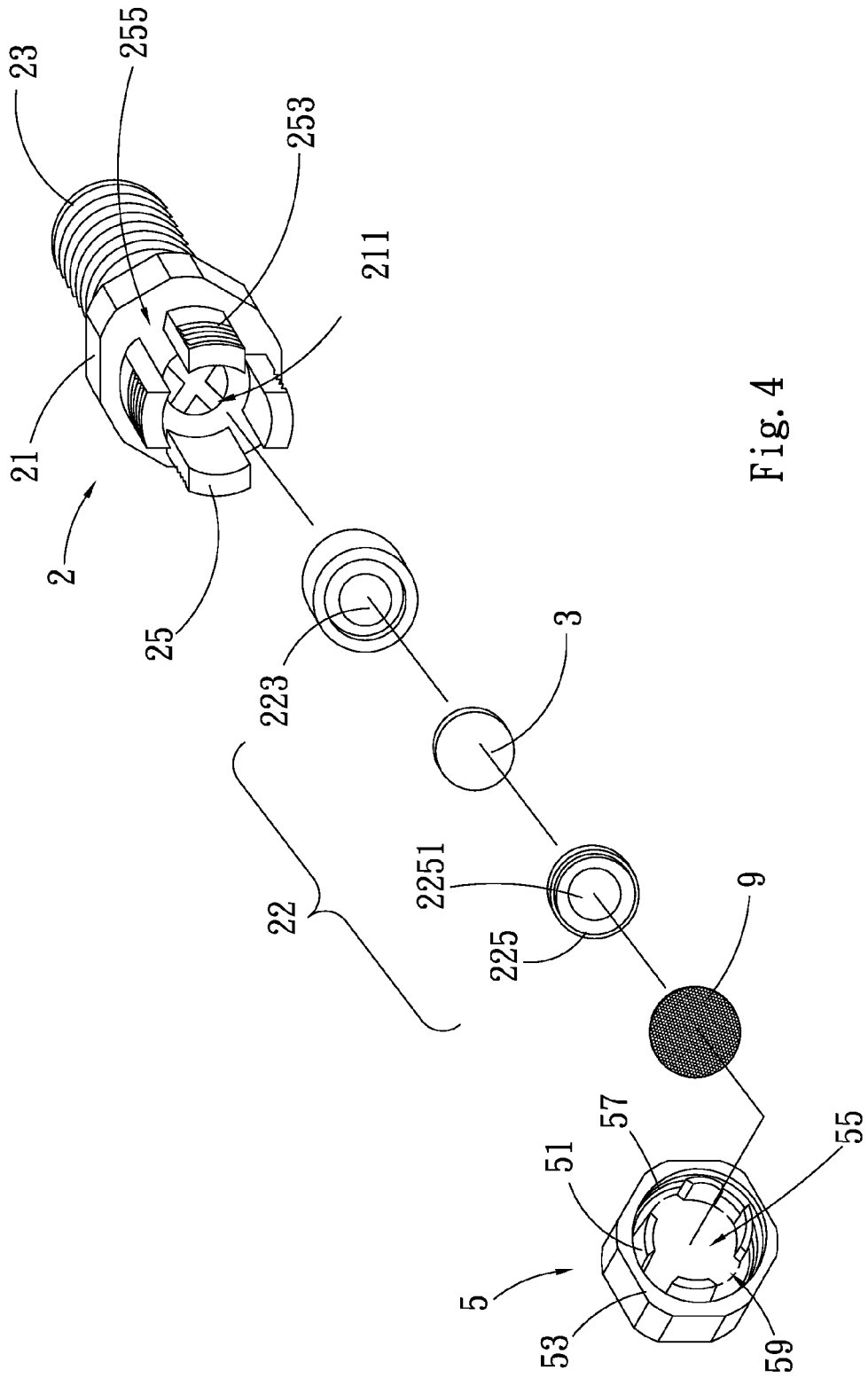
FIG. 4 is an exploded view of the waterproof and breathable plug of FIG. 3 having a different air through hole.
Figure 5:
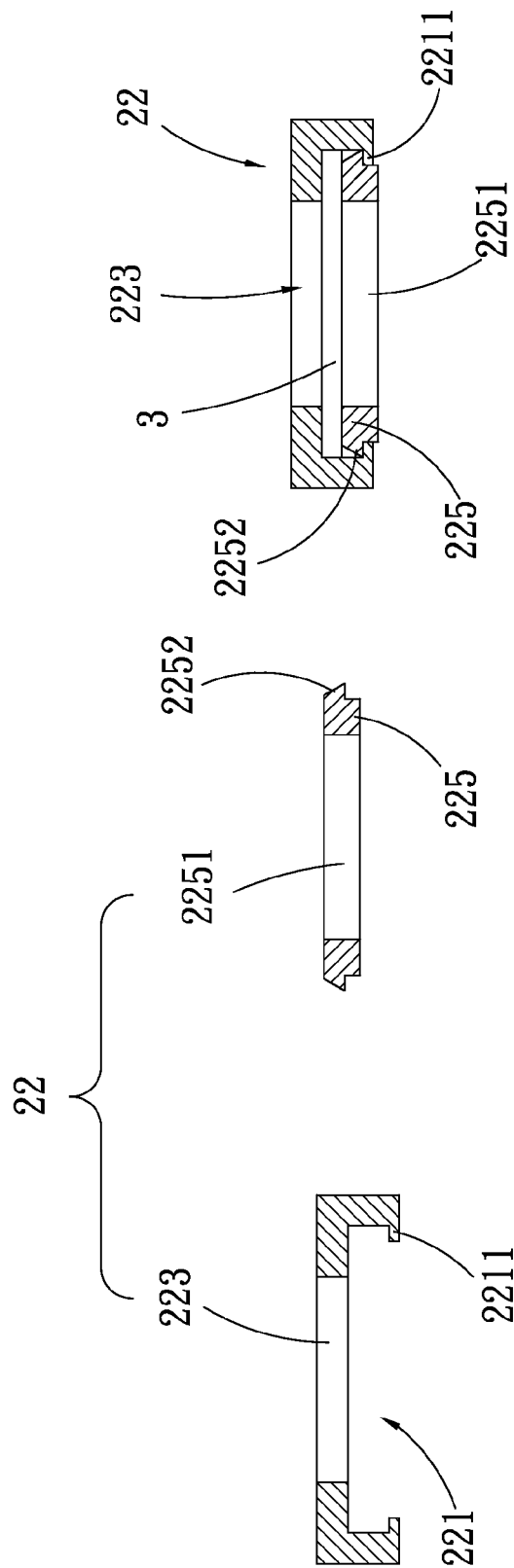
FIG. 5A is a cross-sectional view of a collet of the waterproof and breathable plug of FIG. 3.
FIG. 5B is a cross-sectional view of the collet of FIG. 5A that is assembled.
Figure 6:
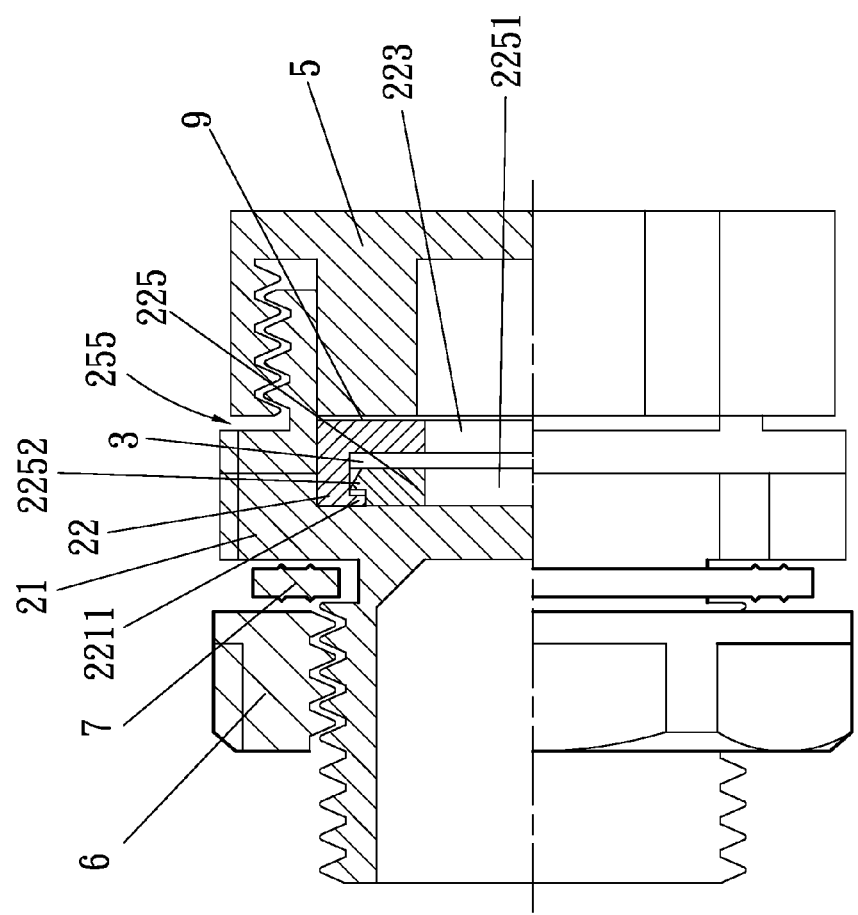
FIG. 6 is a cross-sectional view of the waterproof and breathable plug of FIG. 3 or FIG. 4 that is assembled.
Figure 7B:
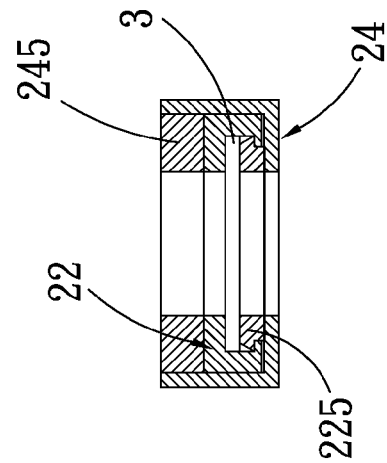
FIG. 7B is a cross-sectional view of the box body of FIG. 7A assembled with a collet and a waterproof and breathable membrane.
Figure 7A:
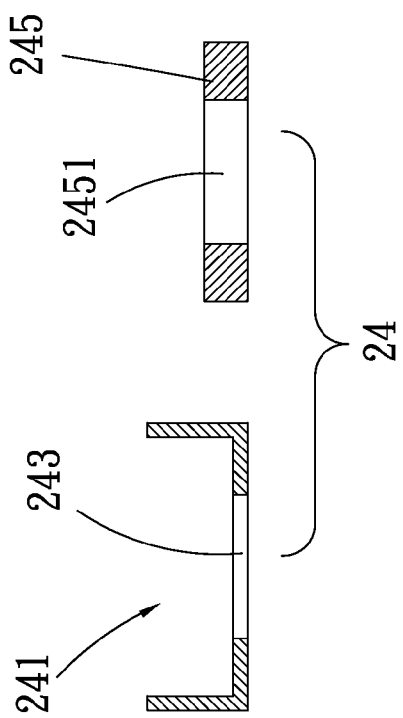
FIG. 7A is a cross-sectional view of a box body of an embodiment according to the present invention.
Figure 7C:
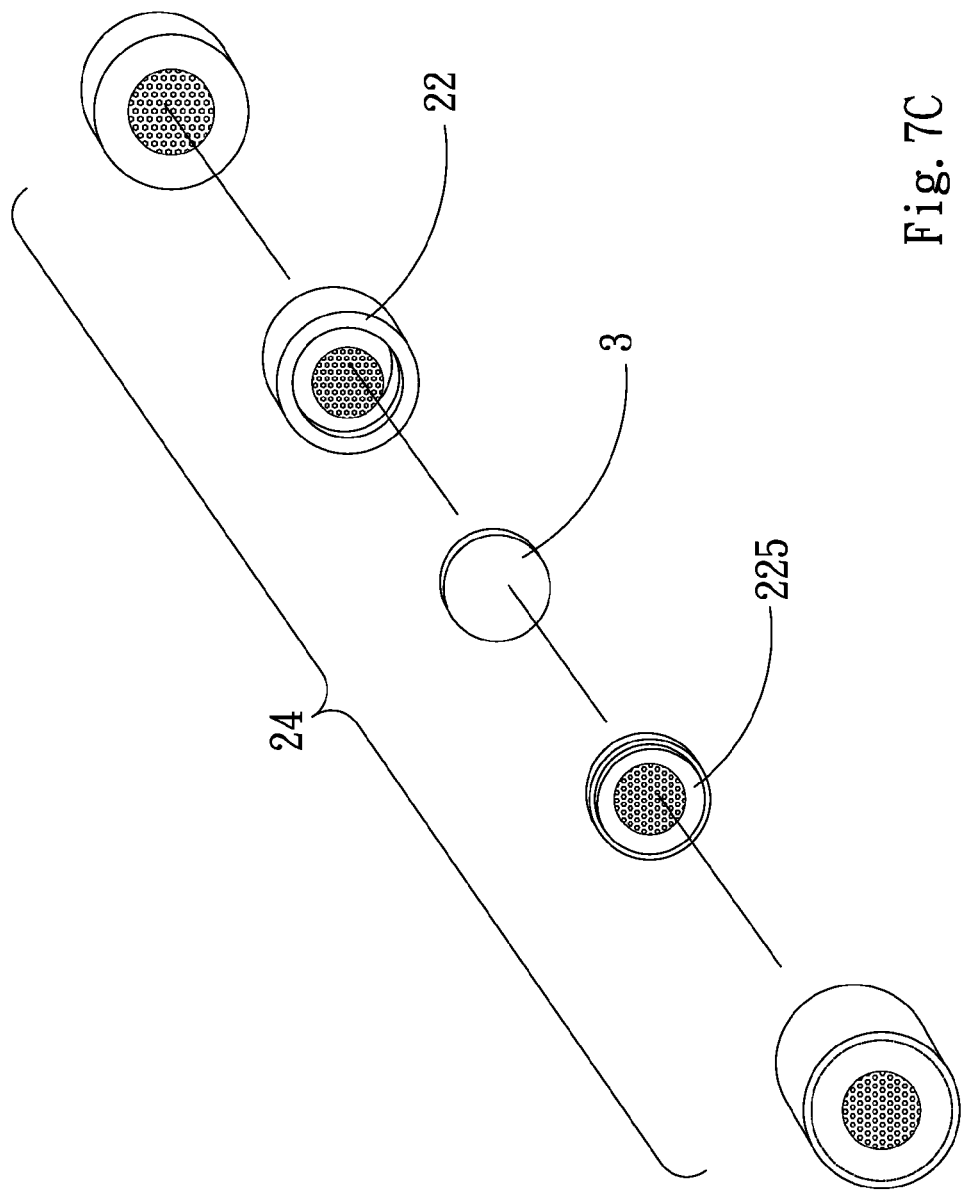
FIG. 7C is an exploded view of the assembly of FIG. 7B.
Figure 7D:
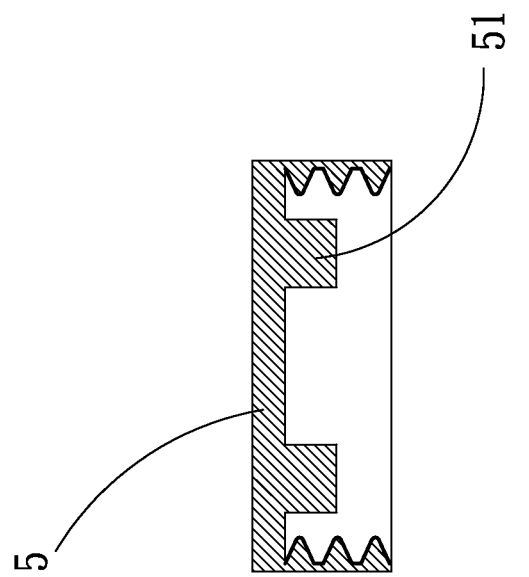
FIG. 7D is a cross-sectional view of a cover member assembled with an air valve of an embodiment according to the present invention.

Refer to FIGS. 3, 5A and 5B. The collet opening 221 is further surrounded by an inner flange 2211. The collet cap 225 has an outer flange 2252 formed on one side rim thereof. The outer flange 2252 hooks in the inner flange 2211, such that the waterproof and breathable membrane 3 may be quickly assemble in or detached from the collet 22.

Referring to FIGS. 9A, 9B, 10A, 10B and 11, an embodiment is shown. In the embodiment, six arched blocks 25 are shown, and the collet 22 is further assembled with a second protection net 90 that is disposed between the waterproof and breathable 3 in the collet 22 and the collet cap 225, while the first protection net 9 is disposed between the waterproof and breathable membrane 3 and the collet 22. When the tubular screw rod 23 of the waterproof and breathable plug passes through and is assembled with an electrical box (not shown), insects that stay in the electrical box may crawl from the electrical box via the tubular screw rod 23 into the waterproof and breathable plug. The second protection net 90, at one side, and the first protection net 9, at the other side, prevent the insects from damaging the waterproof and breathable membrane 3.

In an embodiment, a first air through hole cushion 3 is assembled between the first protection net 9 and the waterproof and breathable membrane 3, and a second air through hole cushion 40 is assembled between the second protection net 90 and the waterproof and breathable membrane 3. The first air through hole cushion 4 and the second air through hole cushion 40 may clamp the waterproof and breathable membrane 3 and allow air to flow therethrough. The second protection net 90 and the first protection net 9 may clamp the first air through hole cushion 4 and the second air through hole cushion 40, respectively, to prevent insects from damaging the waterproof and breathable membrane 3.

In an embodiment, the collet cap 225 has an outer flange 2231 on one side rim thereof, and a plurality of bumps 2233 on the other side rim thereof corresponding to the outer flange 2231. The collet opening 221 of the collet 22 is surrounded by an inner flange 2211, free openings 255 are defined gaps between the arched blocks 25 to form a plurality of hooking functions. The outer flange 2231 of the collet cap 225 is hooked to the inner flange 2211 of the collet opening 221 (referring to FIG. 11). The air valve 51 passes through and is installed on inner sides of the arched blocks 25. The free openings 255 that provide the hooking functions hook the bumps 2233.

The collet 22 has a plurality of pins 2235 on one side thereof adjacent the bumps 2233. In an embodiment, the collet 22 is installed in the arched blocks 25 in a different manner from the above embodiments. The air valve 51 assembled with the cover member 5 passes through and is installed on inner sides of the arched blocks 25, and the free end of the air valve 51 props against the pins 2235.

When an electrical box that is assembled with the waterproof and breathable plug according to the present invention is applied to a vibration machine, the pins 2235 may prop against the free end of the air valve 51 on the inner side of the cover member 5 to damp the rotation and vibration of the cover member 5, preventing the cover member and the first protection net 9, the waterproof and breathable membrane 3 and the collet 22 that are propped by the cover member 5 from being loosed.

Referring to FIGS. 12A, 12B, 12C, 12D and 13, another embodiment is shown. In the embodiment, the waterproof and breathable membrane 3 is installed in the collet 22, and the collet 22 is further assembled with a box body 24. In an embodiment, the box body 24 is made of metal or soft material, such as rubber and plastic soft material. The box body 24 comprises an opening 241 formed on one side thereof, and a third air through hole 243 formed on the other side thereof. The collet 22 is assembled in the box body 24.

The air valve 51 comprises a body 511 and a plurality of valve pieces 513 equiangularly spaced around the body 511. The body 511 has a fourth air through hole 512. In the embodiment, the body 511 also acts as a box cover. The air valve 51 is assembled with the opening 241 of the box body 24, the valve pieces 513 of the air valve 51 have free ends propping against the collet 22 and restricting the collet 22 from sliding. The box body 245 may be assembled in and detached from the arched blocks 25 conveniently. The cover member 5 is screwed with the outer threads 253 of the arched blocks 25. The air valve 51 is assembled in the recessed chamber 55 of the cover member 5. The body 511 is propped by the recessed chamber 55 of the cover member 5. The first protection net 9 is assembled in the arched blocks 25 to prop against one side of the box body 245, in order to prevent insects from entering the boxy body 245 and the collet 22 to damage the waterproof and breathable membrane 3 therein. The free ends of the valve pieces 513 of the air valve 51 prop against the collet 22 and restrict collet 22 from sliding.

In the above embodiments, the first protection net 9 and the second protection net 90 are made of metal, plastic or fiber.

In the above embodiments, an O-ring 7 is mounted onto the tubular screw rod 23, the tubular screw rod 23 is mounted onto a fixing through hole of the electrical box, and a force cap nut 6 is further mounted onto the tubular screw rod 23 of the electrical box.

The foregoing descriptions of the detailed embodiments are only illustrated to disclose the features and functions of the present invention and not restrictive of the scope of the present invention. It should be understood to those in the art that all modifications and variations according to the spirit and principle in the disclosure of the present invention should fall within the scope of the appended claims.

What is claimed is:

1. A waterproof and breathable plug, comprising:
   a plug body comprising a mounting base, a tubular screw rod and a plurality of arched blocks, wherein the mounting base has an air vent disposed in a central region thereof, the tubular screw rod is formed on one side of the mounting base and communicating with the air vent, each of the arched blocks has an outer thread disposed on an outer wall thereof, the arched blocks surround the air vent on the other side of the mounting base, and the arched blocks have gaps therebetween defining free openings;
   a waterproof and breathable membrane assembled in the arched blocks;
   a cover member comprising a cap nut, the cap nut having a recessed chamber formed on an inner side thereof, the recessed chamber having a threaded inner wall disposed on a periphery thereof; and
   an air valve assembled in the recessed chamber of the cover member and spaced from the threaded inner wall at an interval, the outer threads of the arched blocks of the plug body being screwed into the interval and screwed with the threaded inner wall, the air valve penetrating inner sides of the arched blocks.

2. The waterproof and breathable plug of claim 1, further comprising a first protection net disposed in the arched blocks to prop against one side of the waterproof and breathable membrane.

3. The waterproof and breathable plug of claim 2, wherein the first protection net is made of metal, plastic or fiber.

4. The waterproof and breathable plug of claim 2, further comprising an O-ring and a force cap nut, wherein the O-ring is mounted onto the tubular screw rod, the tubular screw rod penetrates a fixing through hole of an electrical box, and the force cap nut is further mounted onto the tubular screw rod of the electrical box.

5. The waterproof and breathable plug of claim 2, wherein the waterproof and breathable membrane is further assembled with a collet having a collet opening, a first air through hole and a collet cap, wherein the collet opening is formed on one side of the collet, the first air through hole is formed on the other side of the collet, the collet cap has a second air through hole disposed in a central region thereof, the waterproof and breathable membrane is assembled with the collet, the collet cap is assembled with the collet opening, and the collet is assembled in the arched blocks.

6. The waterproof and breathable plug of claim 5, wherein the first protection net is made of metal, plastic or fiber.

7. The waterproof and breathable plug of claim 5, further comprising a box enclosing the collet;
   the box comprising a box body having an opening, a third air through hole and a box cover, the opening is formed on one side of the box body, the third air through hole is formed on the other side of the box body, the box cover has a fourth air through hole disposed on a central region thereof, the collet is assembled in the box body, and the box cover is assembled with the opening.

8. The waterproof and breathable plug of claim 5, wherein the collet is further assembled with a second protection net disposed between one side of the waterproof and breathable membrane and the collet cap, and the first protection net is disposed between the waterproof and breathable membrane and an inner side of the collet.

9. The waterproof and breathable plug of claim 8, wherein the collet cap has an outer flange surrounding one side rim thereof and a plurality of bumps surrounding the other side rim opposing the outer flange, wherein the collet opening of the collet is surrounded by an inner flange hooked with the outer flange, the collet is assembled with the arched blocks, and the free openings hook the bumps.

10. The waterproof and breathable plug of claim 9, wherein the collet opening is surrounded by an inner flange, and the collet cap has an outer flange surrounding one side rim thereof and hooked with the inner flange.

11. The waterproof and breathable plug of claim 8, wherein the collet opening is surrounded by an inner flange, and the collet cap has an outer flange surrounding one side rim thereof and hooked with the inner flange.

12. The waterproof and breathable plug of claim 8, wherein a first air through hole cushion is further assembled between the first protection net and the waterproof and breathable membrane, a second air through hole cushion is further assembled between the second protection net and the waterproof and breathable membrane, the first air through hole cushion and the second air through hole cushion clamp the waterproof and breathable membrane with two sides thereof, and the second protection net and the first protection net clamp the first air through hole cushion and the second air through hole cushion with two sides thereof.

13. The waterproof and breathable plug of claim 12, wherein the collet opening is surrounded by an inner flange, and the collet cap has an outer flange surrounding one side rim thereof and hooked with the inner flange.

14. The waterproof and breathable plug of claim 12, wherein the collet cap has an outer flange surrounding one side rim thereof and a plurality of bumps surrounding the other side rim opposing the outer flange, the collet opening of the collet is surrounded by an inner flange hooked with the outer flange, the collet is assembled with the arched blocks, and the free openings hook the bumps.

15. The waterproof and breathable plug of claim 5, wherein the collet cap has an outer flange surrounding one side rim thereof and a plurality of bumps surrounding the other side rim opposing the outer flange, the collet opening of the collet is surrounded by an inner flange hooked with the outer flange, the collet is assembled with the arched blocks, and the free openings hook the bumps.

16. The waterproof and breathable plug of claim 15, wherein the collet opening is surrounded by an inner flange, and the collet cap has an outer flange surrounding one side rim thereof and hooked with the inner flange.

17. The waterproof and breathable plug of claim 15, wherein the collet has a plurality of pins disposed on one side of the bumps, and the air valve assembled with the cover member penetrates an inner side of the arched blocks and has a free end propping against the pins.

18. The waterproof and breathable plug of claim 5, further comprising a box enclosing the collet;
   the box comprising a box body having an opening formed on one side of the box body, and a third air through hole formed on the other side of the box body, and the collet is assembled in the box body;
   the air valve has a body and a plurality of valve pieces perpendicularly equiangularly spaced around the body, wherein the body has a fourth air through hole, the air valve is assembled with the opening of the box body, the valve pieces of the air valve have free ends propping against the collet and restricting the collet from sliding, the cover member is screwed with the outer threads of the arched blocks, the air valve is assembled in the recessed chamber of the cover member, the body is propped by the recessed chamber of the cover member, and the first protection net is assembled in the arched blocks to prop against one side of the box body.

19. The waterproof and breathable plug of claim 5, wherein the collet opening is surrounded by an inner flange, and the collet cap has an outer flange surrounding one side rim thereof and hooked with the inner flange.

20. The waterproof and breathable plug of claim 1, further assembled with an O-ring and a force cap nut, wherein the O-ring is mounted onto the tubular screw rod, the tubular screw rod penetrates a fixing through hole of an electrical box, and the force cap nut is further mounted onto the tubular screw rod of the electrical box.

* * * * *